United States Patent [19]

Bessonneau et al.

[11] Patent Number: 4,698,661
[45] Date of Patent: Oct. 6, 1987

[54] ENCAPSULATING BOX FOR A POWER SEMICONDUCTOR WITH IMPROVED INPUT-OUTPUT INSULATOR

[75] Inventors: Guy Bessonneau, Marny-les-Hameaux; Bernard Carnez, Magny-les-Hameaux; Henry Derewonko, Les Ulis; Joël Lepage, Longpont sur Orge, all of France

[73] Assignee: Thomson-CSF, Paris, France

[21] Appl. No.: 9,627

[22] Filed: Jan. 23, 1987

Related U.S. Application Data

[63] Continuation of Ser. No. 799,297, Nov. 20, 1985, abandoned, which is a continuation of Ser. No. 565,812, Dec. 27, 1983, abandoned.

[30] Foreign Application Priority Data

Dec. 28, 1982 [FR] France .............................. 82 21860

[51] Int. Cl.⁴ ...................... H01L 23/02; H01L 23/12
[52] U.S. Cl. ........................................ 357/74; 357/84
[58] Field of Search ............................................. 357/74

[56] References Cited

U.S. PATENT DOCUMENTS 4,455,448 6/1984 Bertolina .............................. 174/35

Primary Examiner—Robert E. Wise
Attorney, Agent, or Firm—Oblon, Fisher, Spivak, McClelland & Maier

[57] ABSTRACT

The invention relates to an encapsulating box for a semiconductor operating in the range 2 to 20 GHz.

At these frequencies, existing boxes have a metal base, an insulating frame and a cover. Two input - output connections pass through the frame. A leak line forms between the input and output by stray capacitive coupling of the connections with the welding metal bands of the cover. The invention opposes this input - output coupling by metallization of the box, with reserves for resists around the connection passages. The metal film joining the welding metal films to the electrical earth of the base reflects the power taken by capacitive coupling on the connections.

Insulation obtained: −30 db at 15 GHz. Application to ultra-high frequency components.

6 Claims, 7 Drawing Figures

ENCAPSULATING BOX FOR A POWER SEMICONDUCTOR WITH IMPROVED INPUT-OUTPUT INSULATOR

This application is a continuation of abandoned application Ser. No. 799,297, filed Nov. 20, 1985, which is a continuation of abandoned parent application Ser. No. 565,812, filed Dec. 27, 1983.

The present invention relates to an encapsulating box or case for a semiconductor operating in the frequency range between 2 and 20 GHz. The box according to the invention brings about an improvement in the insulation between its input and output connections by means of a metal film covering the entire box, except around the input - output connections, said metal films being grounded.

The semiconductor devices according to the invention are ultra-high frequency semiconductors operating between 2 and 20 GHz. Semiconductor devices operating at lower frequencies can also be encapsulated in such boxes, but the energy dispersion phenomena are not the same at low frequency. The ultra-high frequency component chips are fitted in boxes adapted to the frequency conditions and which generally have a metal base for fixing the box and evacuating the heat given off in operation, and an insulating frame through which passes two metal bands or strips forming two outer connections, the third connection being formed by the base. Semiconductors mounted in such boxes operate very well, if the box does not have a cover. However, a cover is necessary for protecting the semiconductor chip and its fragile links by gold wires with the external connections.

Closing the box by means of an insulating cover makes it necessary to have a ceramic-to-ceramic weld, it not being possible for the box and its cover to be made from a polymer insulant. As a result of stray capacitive couplings at the two connecting strips, the closing weld band leads to input - output coupling, which deteriorates the input - output insulation of the semiconductor by shunting it by a parasitic network.

SUMMARY OF THE INVENTION

According to the invention the box, made from insulating material, is metallized over its entire surface by a good electricity-conducting metal film joined to the metal base and the electrical ground of the circuit, with only metallization reserves or photo-resist around the passages of the external connections, in order not to prevent a short-circuit from existing between them. The energy fraction sampled on an external connection by means of a stray capacitor is reflected by the electrical ground at the surface of the box.

The present invention more specifically relates to an encapsulating box for a power semiconductor operating in a frequency range between 2 and 20 GHz, comprising a metal base, a frame made through an insulating material and through which pass at least two external connections having access to the encapsulated semiconductor called the input and output connections, and a cover made from an insulating material, fixed to the frame by welding by means of a metal film deposited on the free face of the frame and a metal film deposited on the face of the cover facing the frame, wherein the insulation between the input and output connections is improved by a metal film outside the frame, said metal film except around the input - output connections and is in electrical contact on the one hand with the metal welding films of the cover and on the other with the metal base, which is at the electrical ground of the circuit incorporating the semiconductor encapsulated into said box.

BRIEF DESCRIPTION OF THE DRAWINGS

The invention is described in greater detail hereinafter relative to non-limitative embodiments and the attached drawings, wherein.

DETAILED DESCRIPTION OF THE INVENTION

Figure 1:
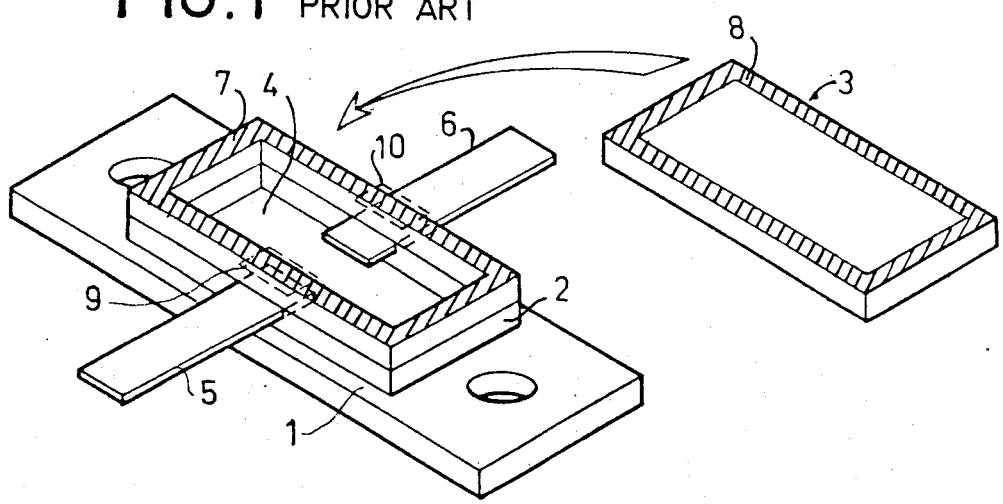
FIG. 1 is a three-quarter view of a prior art open ultra-high frequency box.

FIG. 1 is a three-quarter view in the space of a power box for a semiconductor operating at very high frequencies, whose cover has been removed and turned over so as to better show the box structure. In the case of such a power box, which is shown here in a rectangular shape, but for which the shape can also be circular or square, the main parts are a generally metallic, e.g. copper or brass base 1, whose surface is gold-coated, an insulating frame 2 made from ceramic, alumina or beryllium oxide, formed from two superimposed portions and a cover 3, which is also of ceramic, alumina or beryllium oxide.

When closed, the thus formed assembly constitutes a tight enclosure 4, within which is fixed a semiconductor device, which is not shown here. When the latter is a transistor-type semiconductor and has three electrodes, one of the contacts is provided on metal base 1 by means of its substrate and the two other contacts are on the external access connections 5, 6, which pass through the thickness of frame 2 and which, in ultra-high frequency, are metal plates or strips. These two outer connections 5 and 6 will be called input and output connections hereinafter.

In order to tightly close this known box, the outer free surface of frame 2 is metallized by a metal strip or band 7 and cover 3 is also metallized by a metal strip or band 8, which has the same shape and dimensions as strip 7 of frame 2. The box is closed by welding, by feeding a soft solder between the two metal strips 7 and 8.

When a semiconductor device operating at high frequencies is encapsulated in such a box, energy radiates and in particular two stray capacitors are formed at the points where the input and output connections 5 and 6 are passed through frame 2. The fraction of connection 5 passing through the thickness of frame 2 and the fraction 9 of the metallization strip 7 deposited on the top of the frame, form the two foils or coatings of a stray capacitor, whose dielectric is the alumina or ceramic insulating material of frame 2. In the same way, a second stray capacitor is formed between the fraction of output connection 6 passing through the frame, the fraction 10 of strip 7 and the material of frame 2. These two stray capacitors act as coupling capacitors and are interconnected by a line, which is not resistive and is constituted by the metal film 7 on the frame, metal film 8 on the cover and the welding band joining these two metal films.

Therefore, in the high-frequency range, there exist a double possibility of resonance. On the one hand, there can be cavity resonance, but in view of the working frequency of the semiconductor device, the dimensions given to the box obviate any possibility of cavity resonance. However, on the other hand, the junction metal film between the box and its cover can give rise to line resonance, acting as a single loop of a choke joined to the input and output connections by two coupling capacitors. This is shown in FIG. 2, which is an equivalent circuit diagram of such a box.

The input and output connections 5 and 6 are all that is shown and the two strap capacitors are formed by a fraction of the ceramic material of frame 2 and by a fraction 9 or 10 of the cover closing metal film. These two stray capacitors are joined to one another by a direct line, represented by metal films 7 and 8, and this direct line short-circuits the semiconductor device T. The power transmitted from the input connection 5 to the output connection 6 is symbolized by the line appearing above the circuit diagram and for a power $E_i$ on the input connection, there is a non-negligible power $E_o$ on the output connection, so that there is not a good insulation between the input and output connections.

Figures 2, 3:
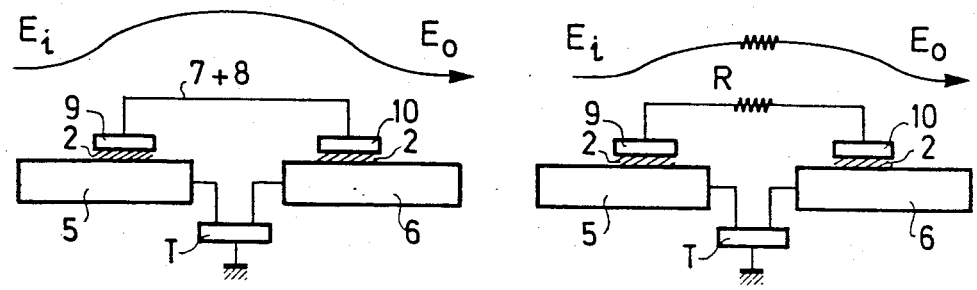
FIG. 2 is the equivalent circuit diagram of the box of FIG. 1.
FIG. 3 is the equivalent circuit diagram of an improved prior art box.

FIG. 3 shows the equivalent circuit diagram of a box according to the prior art, improved according to French Patent application No. 8,109,935 of the Applicant Company. The box according to this patent application has the same geometrical configuration as that of FIG. 1, or any other box according to the prior art. However, the solution given to the problem of deterioration of the insulation between the input and output connections consists of a resistive metallization of a surface of the ceramic cover, said metallization covering the lateral edges of the ceramic plate forming the cover and which is in electrical contact with the soft solder preform or deposit for welding the cover to the box. The direct connection between the stray capacitors is replaced by a loss line and the very high resistance of the metal film greatly reduces the coupling between the stray capacitors and the input - output connection. At the frequencies involved of approximately 1 to 100 GHz, the propagation mode of the electrical waves in or on the ceramic material of the cover and in the resistive coating ensures that the weld does not constitute a short-circuit for the resistive metal film.

Thus, in FIG. 3, the direct line shown in FIG. 2 is replaced by a high value resistance and the energy taken on input connection 5 by the first stray capacitor is reduced by the passage through this high resistance and only part of the energy $E_o$ is transmitted to the output connection 6. This constitutes an improvement, but there is still a certain energy loss via an RC coupling between the input and the output. For example, in the case of a 14 GHz operating frequency of the encapsulated semiconductor device, the insulation between the input and output connection reaches −15 db.

Figure 4:
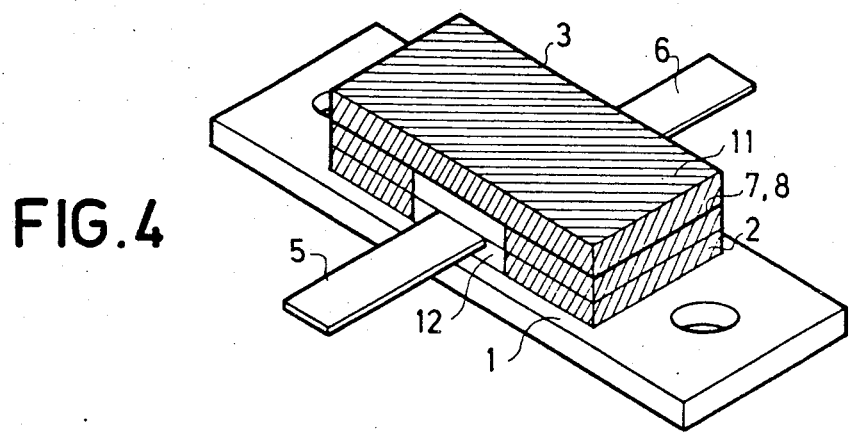
FIG. 4 is a three-quarter view of a box according to the invention.

FIG. 4 is a three-quarter view of the box according to the invention. This box has the same geometrical shape as the box of FIG. 1, or that of the box described in the aforementioned patent French application. However, it could equally well be square or circular, or some other shape. It has a metal base 1, a ceramic frame 2 and a closing cover 3. Two input and output connections 5 and 6 pass through the thickness of the ceramic frame. In order to improve the input - output insulation of the encapsulated device, the complete outer surface of the box, frame 2 and cover 3 is metallized by a conductive metal film 11, except for passages 12 around the two input - output connections 5, 6, said passages being left to present contact between the metals of the connections and the metal of metal film 11, which would lead to an input - output short-circuit. This metallization on the one hand takes place on cover 3 and on the other on the box without its cover, i.e. as shown in FIG. 1. During metallization, a mask protects the central portion of the box to which will be fixed the semiconductor chips, as well as the two resists formed around the passages of the two input and output connections. Thus, as a result of the box production process, the metal film deposited on the ceramic frame 2 is in contact with the metal base 1 of the box and when the cover is welded in order to close the box, it is the assembly constituted by base 1, metal film 11 on frame 2 and metal film 11 on cover 3, which constitutes the electrical earth of the box. As the metallization of the frame takes place on an open box, the interior part of the frame, (i.e. that portion) within the cavity of the box, is also metallized).

Under the conditions, the stray capacitors formed between a fraction of the input - output connection strips 5, 6 and the corresponding fractions of the metallization strip 7 on the upper part of frame 2 still exist, but the energy $E_i$ taken from the input connection 5 in this type of box by the corresponding stray capacitor is reflected by the earth, because it is known that in ultra-high frequency a wave is reflected by an open circuit or an earth. A very small part of the incident energy $E_i$ is transmitted to the output connection 6. This is shown in FIG. 5, which is the equivalent circuit diagram of the box according to the invention.

Figure 5:
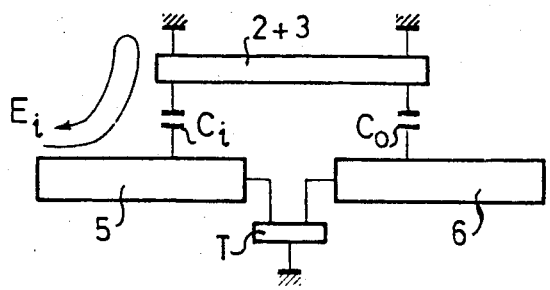
FIGS. 5 and 6 are equivalent circuit diagrams of the box according to the invention.
Figure 6:
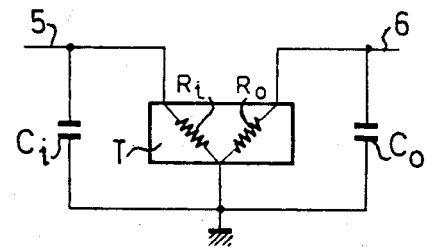

As compared with FIGS. 2 and 3, in FIG. 5 the assembly of frame 2 and cover 3, which is metallized and welded, constitutes an entity, which is electrically earthed. Therefore, the difference compared with FIG. 2 is that there is a non-resistive direct line between the two input and output connections, said direct line being earthed at the point closest to which the incident energy is taken and closest to the point where the output energy is supplied. The equivalent circuit diagram of FIG. 6 shows that if $R_i$ is the input impedance of semiconductor device T, the incident wave on input connection 5 is transmitted across a RC network formed by impedance $R_i$ on the semiconductor and the input capacitance $C_i$ of the box. In the same way, the output impedance is formed by $R_o$ and $C_o$, $R_o$ being the output impedance of the semiconductor device and $C_o$ the stray output capacitance of the box.

Figure 7:
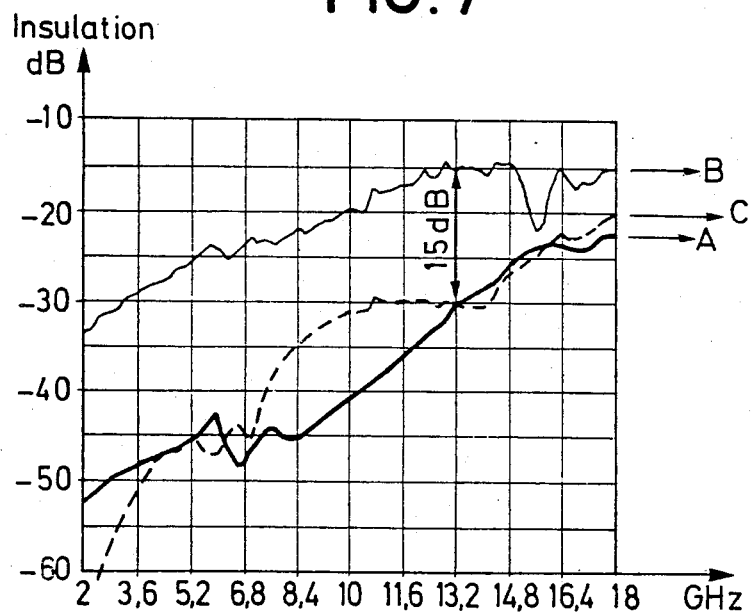
FIG. 7 is a showing of the comparative insulation curves as a function of the frequency of several boxes according to the prior art and the invention.

FIG. 7 shows comparative insulating curves as a function of the frequency of several boxes for ultra-high frequency semiconductors. The frequencies between 2 and 18 GHz are given on the abscissa, whilst the insulation in decibels is given on the ordinate.

Curve A, in thick continuous line form, represents the insulation - frequency curve of an open box, i.e. as shown in FIG. 1, but without metal film 7. The insulation conditions are better for an encapsulated semiconductor, but in many cases this solution is not possible, particularly for all military and space equipment which must be protected. The continuous, fine line curve B gives the insulation - frequency characteristic of a box improved according to French Patent Application No.

8,109,935. This curve shows the relatively monotonic form of the insulation, in the sense that the insulation value increases roughly regularly between 2 and 18 GHz without there being, as is the case with unimproved boxes, two almost complete absorption peaks at 10 and 15 GHz. Thus, curve B shows that at 15 GHz, insulation is approximately −20 db. Finally, the dotted line curve C gives the insulation value of a box according to the invention. It can be seen that at 15 GHz, there is an insulation improvement of approximately 15 db and that this reaches −30 db. At 18 GHz, the improvement to the insulation is still approximately −20 db.

The metal film making it possible to reflect the incident energy by earthing the box is, for example, a metal film of the gold-germanium type, deposited by cathodic sputtering in a thickness of 1000 Å, followed by a gold enrichment a few microns thick. However, it is also possible to use any other conductor metal which is less costly than gold. It is also possible within the scope of the invention to only metallize frame 2 and to use cover 3, covered with a resistive metal coating, as described in the aforementioned French Patent application. Within the scope of the invention, it is also possible to only metallize one or preferably two strips on the sides of ceramic frame 2. These metallized strips are obviously in each case as close as possible to the external connections 5, 6, thereby leaving the photo resist 12 so as prevent grounding. The result increases in effectiveness if the stray capacitors are grounded as close as possible to external connections 5 and 6. In the case of metallization in the form of strips, in FIG. 4 it is merely necessary to metallize the two sides of frame 2 carrying the external connections 5 and 6. Obviously, these strips must also be in contact with the closing metal films 7+8 and with base 1 at ground earth.

The above description of the invention based on the case of devices with three electrodes, and on the case of rectangular boxes, applies equally well to any other random type of ultrahigh frequency semiconductor device, no matter what the number of access electrodes and no matter what the shape of the box. The basis of the invention is to take the energy tapped by means of a stray capacitor as close as possible to a point at which said energy is tapped and to reflect it by earthing the box assembly. More generally, the invention is defined by the following claims.

What is claimed is:

1. An encapsulating box for power semiconductors operating in the hyperfrequency range comprising:
    a metal base for evacuating the heat given off by said power semiconductor, said metal base being electrically grounded;
    a ceramic frame supported by said metal base;
    a ceramic closing cover covering said ceramic frame and said metal base, said closing cover being fixed to the frame by welding by means of a metal film deposited on the free face of the frame and a metal film deposited on the face of the cover facing the frame;
    At least two input and output metallic ribbon connections passing through and fritted to said frame for electrical connection to the power semiconductor, said metallic ribbons and said metal film on the frame creating stray capacitors;
    a conductive metal film covering the outer surfaces of the space defined by said frame and said closing cover except in the area immediately surrounding said input and output connectors and which is in contact with the electrical ground and with the metal welding films of the frame and the cover, so as to reflect the signals from said stray capacitors.

2. An encapsulating box according to claim 1, wherein the cover is metallized on its outer face and on its lateral faces.

3. An encapsulating box according to claim 1, wherein the frame is also metallized on its inner walls, except in the area immediately around said input-output connections.

4. An encapsulating box according to claim 1, wherein the metal film of the frame is limited to at least one metal strip, which joins the metal welding bands of the cover to the metal base.

5. An encapsulating box according to claim 1, wherein the metal film of the frame and the cover is constituted by a 0.1 micron thick gold - germanium deposit and by a 1 to 5 micron thick gold deposit.

6. An encapsulating box for power semiconductors operating in the hyperfrequency range comprising:
    a metal base for evacuating the heat given off by said power semiconductor, said metal base being electrically grounded;
    a ceramic frame supported by said metal base;
    a ceramic closing cover covering said ceramic frame and said metal base, said closing cover being fixed to the frame by welding by means of a metal film deposited on the free face of the frame and a metal film deposited on the face of the cover facing the frame;
    At least two input and output metallic ribbon connections passing through and fritted to said frame for electrical connection to the power semiconductor, said metallic ribbons and said metal film on the frame creating stray capacitors;
    a resistive layer covering said closing cover with at least one metallic strip on the side of said ceramic frame joining the resistive layer and the metal films with the metal base.

* * * * *